United States Patent [19]
Klose

[11] Patent Number: 5,714,397
[45] Date of Patent: Feb. 3, 1998

[54] PROCESS FOR PRODUCING LATERAL BIPOLAR TRANSISTOR

[75] Inventor: Helmut Klose, München, Germany

[73] Assignee: Siemens Aktiengesellschaft, Munich, Germany

[21] Appl. No.: 666,101

[22] Filed: Jun. 19, 1996

Related U.S. Application Data

[62] Division of Ser. No. 250,281, May 27, 1994, abandoned.

[30] Foreign Application Priority Data

May 27, 1993 [DE] Germany .................... 43 17 720.4

[51] Int. Cl.$^6$ ................................................. H01L 21/265
[52] U.S. Cl. ................................ 437/32; 437/31; 437/33
[58] Field of Search ............................ 437/31, 32, 33

[56] References Cited

U.S. PATENT DOCUMENTS 4,903,106 2/1990 Fukunaga et al. .
5,406,113 4/1995 Horie .

FOREIGN PATENT DOCUMENTS 0 137 992 4/1985 European Pat. Off. .

OTHER PUBLICATIONS

Muller et al., "Device Electronics for IC's", p. 327, 1986.
Japanese Journal of Applied Physics, vol. 30, No. 128, Dec. 1191, pp. L2080–L2082 (Hugh et al.) "A New SO1–Lateral Bipolar Transistor for High–Speed Operation".
IBM Technical Disclosure Bulletin, vol. 32, No. 3B, Aug. 1989, pp. 59–60, "High–performance vertical NPN with SO1–Lateral PNP".
IBM Technical Disclosure Bulletin, vol. 32, No. 6B, Nov. 1989, pp. 157–159, "Lateral Bipolar Transistor with Elevated Base Contact".

*Primary Examiner*—John Niebling
*Assistant Examiner*—Long Pham
*Attorney, Agent, or Firm*—Herbert L. Lerner; Laurence A. Greenberg

[57] ABSTRACT

In a lateral bipolar transistor and a method for producing the same, an emitter layer and a collector layer are disposed on a structured dielectric layer. The structured dielectric layer is located in a plane of a base layer and is interrupted by the base layer in such a way that between the base layer and portions of the structured dielectric layer, the base layer is contacted on one side by the emitter layer and on the opposite side by the collector layer.

4 Claims, 2 Drawing Sheets ial-sectional view of the transistor of the invention;

PROCESS FOR PRODUCING LATERAL BIPOLAR TRANSISTOR

This is a division of application Ser. No. 08/250,281, filed on May 27, 1994 now abandoned.

BACKGROUND OF THE INVENTION

Field of the Invention

The present invention relates to a lateral bipolar transistor on silicon and to a process for producing the same.

A lateral bipolar transistor is known from the Japanese Journal of Applied Physics, Vol. 30, No. 12B, December 1991, pp. L2080–L2082 to include an emitter layer and an emitter contact electrically conductively connected thereto; a collector layer and a collector contact electrically conductively connected thereto; a strip-like base layer, a highly doped base contact layer disposed on top of the base layer and a base contact electrically conductively connected to the base contact layer; dielectric spacers each electrically insulating the base contact layer from a respective one of the emitter and collector layers; and a dielectric layer on which the emitter layer and the collector layer are disposed laterally of the base layer.

In laterally disposed bipolar transistors, a problem often arises of keeping parasitic capacitances low and of achieving high integration density while employing a simple production process.

SUMMARY OF THE INVENTION

It is accordingly an object of the invention to provide a lateral bipolar transistor and a process for producing the same, which overcome the hereinafore-mentioned disadvantages of the heretofore-known devices and methods of this general type and in which the transistor can be produced in as few steps as possible.

With the foregoing and other objects in view there is provided, in accordance with the invention, a lateral bipolar transistor, comprising an emitter layer and an emitter contact electrically conductively connected to the emitter layer; a collector layer and a collector contact electrically conductively connected to the collector layer; a strip-like base layer, a highly doped base contact layer disposed on top of the base layer and a base contact electrically conductively connected to the base contact layer; dielectric spacers each electrically insulating the base contact layer from a respective one of the emitter and collector layers; a dielectric layer on which the emitter layer and the collector layer are disposed laterally of the base layer, the dielectric layer being structured to be disposed in the plane of the base layer and the dielectric layer being interrupted by the base layer; and the emitter layer and the collector layer each having a portion disposed between the dielectric layer and the base layer, with the base layer laterally bordering on the emitter layer and the collector layer.

With the objects of the invention in view, there is also provided a process for producing a lateral bipolar transistor, which comprises applying a silicon layer, with a doping intended for a base layer, on top of an insulation layer, applying a highly doped polysilicon layer for a base connection on top of the silicon layer, applying a dielectric layer on top of the polysilicon layer, and structuring the dielectric and polysilicon layers to make a strip-like portion, in a first step; producing inner spacers of a dielectric laterally of the strip-like portion of the structured layers intended for the base, in a second step; producing outer spacers laterally of the inner spacers from a dielectric being selectively etchable with respect to the dielectric of the inner spacers, in a third step; completely removing the silicon layer located on the insulation layer outside a region covered by a mask formed by the inner spacers, the outer spacers and the structured dielectric layer, so that a silicon layer remains, in a fourth step; applying a further dielectric layer conformally over the entire surface area, in a fifth step; etching back the further dielectric layer in planarizing fashion except for portions remaining laterally of the outer spacers, in a sixth step; selectively removing the outer spacers, in a seventh step; removing a remaining portion of the silicon layer in the vicinity of the removed outer spacers, except for the insulation layer, by using the applied dielectric layers as a mask, to produce openings on both sides, in an eighth step; applying a highly doped layer intended for an emitter and a collector over the entire surface, in a ninth step; etching back the highly doped layer in planarizing fashion and structuring the highly doped layer to create an emitter layer and a collector layer being separate from one another, in a tenth step; and applying a planarization layer of a dielectric, subsequently forming contact holes in the planarization layer for electrical connection, and then applying an emitter contact, a collector contact and a base contact, in an eleventh step.

In accordance with another mode of the invention, there is provided a process which comprises using $SiO_2$ in the first step for the dielectric layer, in the second step for the inner spacers, and in the fifth step for the further dielectric layer, and using $Si_3N_4$ in the third step for the outer spacers.

In accordance with a concomitant mode of the invention, there is provided a process which comprises producing the polysilicon layer doped with $p^+$ conduction in the first step, and producing the highly doped layer being doped with $n^+$ conduction from a silicon-containing material in the ninth step.

The process of the invention assumes a substrate in which a thin layer of silicon is disposed over an insulation layer. This substrate may, for instance, be an SOI substrate, of the kind that can be made by means of SIMOX or wafer bonding. The silicon layer should have a thickness of approximately 100 nm. This silicon layer is provided with a basic doping of approximately $10^{17}$ to $10^{18}$ cm$^{-3}$. Using this starting material, a structure is produced in which a base layer, produced from this original silicon layer, laterally borders on an emitter layer and a collector layer, and these emitter and collector layers, with the exception of a short segment contacting the base layer, are disposed on a dielectric layer.

Other features which are considered as characteristic for the invention are set forth in the appended claims.

Although the invention is illustrated and described herein as embodied in a lateral bipolar transistor and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
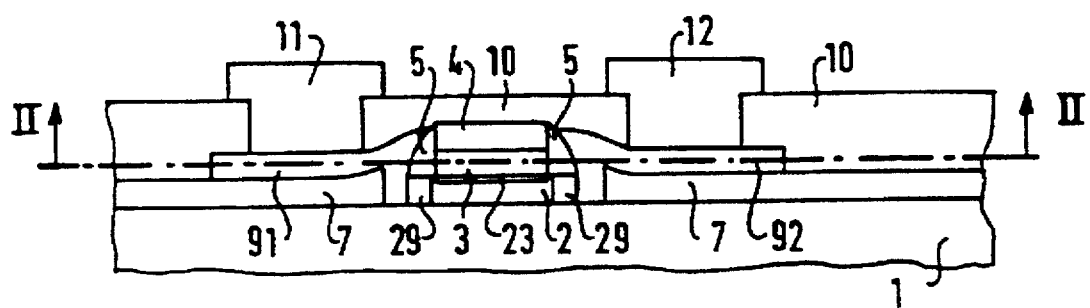
FIG. 1 is a fragmentary, diagrammatic, longitudinal-sectional view of the transistor of the invention.

Referring now to the figures of the drawing in detail and first, particularly, to FIG. 1 thereof, there is seen a structure of a transistor of the invention in which a strip-like doped base layer 2 is located in a region of an actual transistor on an insulation layer 1 of a substrate. Located on this base layer 2 is a highly doped base contact layer 3, which widens in an extension of the strip-like portion to make a larger terminal surface. This base contact layer 3 is electrically insulated on top by a dielectric layer 4 and laterally by inner spacers 5. Bordering the base layer 2 on both sides are an emitter layer 91 and a collector layer 92, which are doped with a conduction type that is opposite that of the base layer. These layers are made of silicon, and the base layer 2 is made from a monosilicon layer that was originally present over the entire surface area, while the other layers are made of polysilicon that was applied afterward. FIG. 1 shows a junction region 23 of the base layer 2 that is created by acceptors or donors which have diffused into the base layer 2 from the base contact layer 3. Correspondingly, junction regions 29 that are correspondingly produced by diffusion of charge carriers out of the emitter layer 91 into the base layer 2 and out of the collector layer 92 into the base layer 2, are located in the base layer 2, in regions that border on the emitter layer 91 and the collector layer 92. Essential components of the emitter layer 91 and the contact layer 92 are each located on a respective dielectric layer 7, which is disposed in the plane of the base layer 2 and each of which is disposed a slight distance away from this base layer 2. In this way the emitter layer 91 and the collector layer 92 each make contact for the base layer 2, between the base layer 2 and the structured dielectric layers 7. This structure is covered on the top with a planarization layer 10 being formed of a dielectric, and an emitter contact 11, a collector contact 12 and a base contact 13 (shown in FIG. 2) are installed in contact holes formed in this planarization layer 10.

Figure 2:
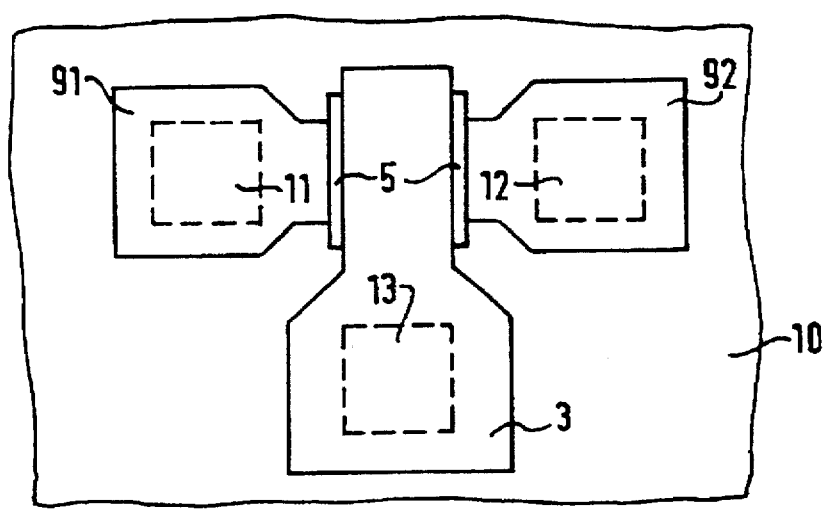
FIG. 2 is a fragmentary, cross-sectional view taken along the line II—II of FIG. 1, in the direction of the arrows.

FIG. 2 shows a cross section taken along the line II—II in FIG. 1, which indicates each of the contact surfaces with dashed lines. The contact surfaces are located between the emitter layer 91 and the emitter contact 11, between the collector layer 92 and the collector contact 12, and between the base contact layer 3 and the base contact 13. It can be seen that the emitter layer 91 and the collector layer 92 are each extended as far as the strip-like portion of the base layer 2 or the base contact layer 3 located on top of it, and that they each widen toward the outside to make connection surfaces. The electrical insulation between the base contact layer 3 and the emitter layer 91 on one hand and between the base contact layer 3 and the collector layer 92 on the other hand, is effected by the spacers 5 as shown.

Figure 3:
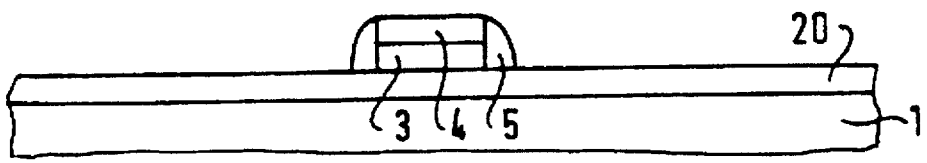
FIGS. 3–7 are fragmentary, longitudinal-sectional views showing various steps in the process for producing the transistor of the invention.

A silicon layer 20 seen in FIG. 3 is provided with basic doping and is located on the insulation layer 1 of the substrate. The production of this transistor is carried out in such a way that a polysilicon layer and a dielectric layer disposed on top of it are deposited over the silicon layer 20, for instance by CVD (chemical vapor deposition). The polysilicon layer for the base is highly doped, which can be done, for instance, by implantation during or after the application of the aforementioned layers. For instance, the dielectric layer may be $SiO_2$ that is applied by using tetraethylorthosilicate. This double layer is then structured, for instance by dry etching processes. What remains of the polysilicon layer is the base contact layer 3 that is structured in strip-like form in the region of the actual transistor, with the dielectric layer 4 disposed on top of it as insulation. Next, a conformal dielectric layer ($CVD-SiO_2$, for instance) is then deposited and etched back anisotropically, in order to produce the lateral spacers 5 in the region of these strip-like portions of the base contact layer 3 and the dielectric layer 4 located on top of it. This procedure is repeated with a further layer having a material which can be selectively etched with respect to the material of the inner spacers 5. In this way, outer spacers 6 are produced on the sides of the inner spacers 5 opposite the base contact layer 3. When $SiO_2$ is used for the inner spacers 5, these outer spacers 6 may be made from $Si_3N_4$, for instance. The inner spacers 5 and the outer spacers 6 are used together with the dielectric layer 4 as a mask, in order to remove from the silicon layer 20 except for the portion intended for the base layer 2.

Figure 4:
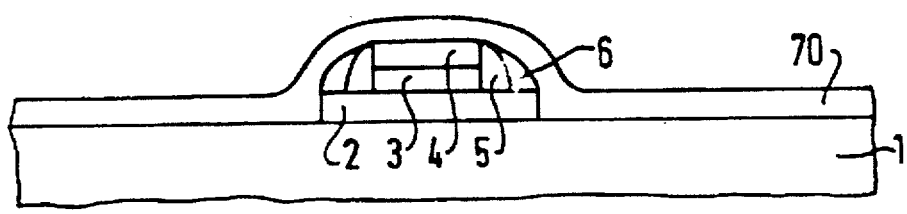
Figure 5:
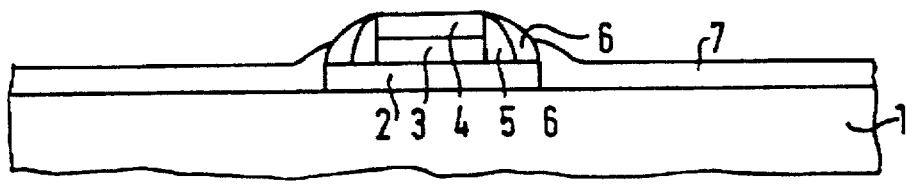
Figure 6:
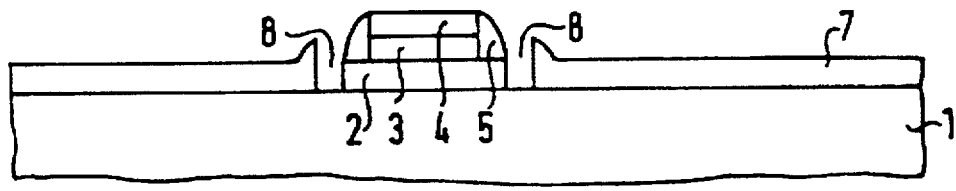

A further dielectric layer 70 is applied conformally over the entire surface area of the structure which is shown in FIG. 4 and which results from this process step (for instance by dry etching). The further dielectric layer 70 is formed of some material (such as $SiO_2$), with respect to which the outer spacers 6 are selectively etchable. This further dielectric layer 70 is etched back in planarizing fashion, as is shown in FIG. 5, for instance by means of CMP (chemical mechanical polishing) or by using photoresist. Remaining portions of this further dielectric layer 70 are the dielectric layers 7 that are now only located laterally of the outer spacers 6 and leave these spacers free at the surface. The outer spacers 6 can therefore be removed (preferably isotropically). Since the further dielectric layer was applied by using a material with respect to which these outer spacers 6 are selectively etchable, the remaining portions 7 of this further dielectric layer 70 are not removed in this etching process. Openings resulting from the removal of the outer spacers 6 are utilized to etch back the base layer 2 in the vicinity of these openings. Openings 8 seen in FIG. 6 in which the surface of the insulation layer 1 is laid bare, are then located between the base layer 2 and the structured dielectric layer 7.

Figure 7:
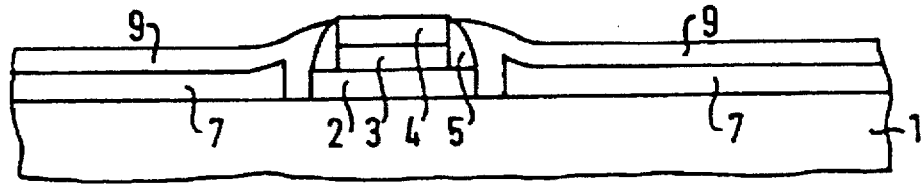

A conformal deposition of a layer 9 of polysilicon or of some other contact material (for instance silicon carbide) is then performed, in order to produce the emitter layer and the collector layer. This layer 9 is highly doped for the emitter and the collector. This can be done either during the application or afterward by implantation. This layer 9, which is seen in FIG. 7, is again etched back in planarizing fashion (by CMP, for instance, or by planarizing by using photoresist). The portions of this layer 9 that remain after this etching process are structured by using resist mask, resulting in the structure shown in a plan view in FIG. 2. The layer 9 breaks apart into the emitter layer 91 and the collector layer 92, with the correspondingly widened connection regions. The planarization layer 10 that is formed of a dielectric is applied, the contact holes are made therein for the electrical connection, and then the contacts of metal are applied for the emitter, the collector and the base.

The transistor according to the invention can therefore be produced over four phototechnology steps and can thus produce an LSI bipolar transistor having an entire active zone which amounts to only 1.8 times the surface area resulting from the minimum structural fineness.

I claim:

1. A process for producing a lateral bipolar transistor, which comprises:

applying a silicon layer, with a doping as a base layer, on top of an insulation layer, applying a highly doped polysilicon layer for a base connection on top of the silicon layer, applying a first dielectric layer on top of the polysilicon layer, and structuring the dielectric and polysilicon layers to make a strip-like portion, in a first step;

producing inner spacers of a second dielectric laterally of the strip-like portion of the structured first dielectric and polysilicon layers as the base, in a second step;

producing outer spacers laterally of the inner spacers from a third dielectric being selectively etchable with respect to the dielectric of the inner spacers, in a third step;

completely removing the silicon layer located on the insulation layer outside a region covered by a mask formed by the inner spacers, the outer spacers and the structured dielectric layer, so that a part of the silicon layer remains, in a fourth step;

applying a further fourth dielectric layer conformally over the entire surface area, in a fifth step;

etching back the further dielectric layer in planarizing fashion except for portions remaining laterally of the outer spacers, in a sixth step;

selectively removing the outer spacers, in a seventh step;

removing a remaining portion of the silicon layer in the vicinity of the removed outer spacers, down to the insulation layer, by using the applied dielectric layers as a mask, to produce openings on both sides of the remaining silicon layer, in an eighth step;

applying a highly doped layer as an emitter and a collector over the entire surface and in the openings, in a ninth step;

etching back the highly doped layer in planarizing fashion and structuring the highly doped layer to create an emitter layer and a collector layer being separate from one another and having portions disposed laterally between the remaining silicon layer and the remaining portions of the further dielectric layer, in a tenth step; and applying a planarization layer of a dielectric, subsequently forming contact holes in the planarization layer for electrical connection, and then applying an emitter contact, a collector contact and a base contact, in an eleventh step.

2. The process of claim 1, which comprises using $SiO_2$ in the first step first dielectric layer, in the second step for the inner spacers, and in the fifth step for the further dielectric layer, and using $Si_3N_4$ in the third step for the outer spacers.

3. The process of claim 1, which comprises producing the polysilicon layer doped with $p^+$ conduction in the first step, and producing the highly doped layer being doped with $n^+$ conduction from a silicon-containing material in the ninth step.

4. The process of claim 2, which comprises producing the polysilicon layer doped with $p^+$ conduction in the first step, and producing the highly doped layer being doped with $n^+$ conduction from a silicon-containing material in the ninth step.

* * * * *